US006790782B1

United States Patent
Yang et al.

(10) Patent No.: US 6,790,782 B1
(45) Date of Patent: Sep. 14, 2004

(54) PROCESS FOR FABRICATION OF A TRANSISTOR GATE INCLUDING HIGH-K GATE DIELECTRIC WITH IN-SITU RESIST TRIM, GATE ETCH, AND HIGH-K DIELECTRIC REMOVAL

(75) Inventors: Chih-Yuh Yang, San Jose, CA (US); Cyrus E. Tabery, Cupertino, CA (US); Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 10/157,450

(22) Filed: May 29, 2002

Related U.S. Application Data

(60) Provisional application No. 60/386,204, filed on Dec. 28, 2001.

(51) Int. Cl.$^7$ ............................................. H01L 21/302
(52) U.S. Cl. .................... 438/706; 438/290; 438/710; 438/712; 438/720
(58) Field of Search ................................ 438/706, 710, 438/712, 720, 733, 290, 283

(56) References Cited

U.S. PATENT DOCUMENTS

| 5,055,383 | A | | 10/1991 | Koblinger et al. ............ 430/312 |
|---|---|---|---|---|
| 5,378,309 | A | | 1/1995 | Rabinzohn .................... 156/643 |
| 6,127,277 | A | * | 10/2000 | DeOrnellas et al. ......... 438/714 |
| 6,133,102 | A | | 10/2000 | Wu .............................. 438/276 |
| 6,174,818 | B1 | * | 1/2001 | Tao et al. ..................... 438/733 |
| 6,436,763 | B1 | * | 8/2002 | Huang et al. ................ 438/255 |
| 6,596,599 | B1 | * | 7/2003 | Guo ............................. 438/305 |

* cited by examiner

*Primary Examiner*—Lan Vinh
(74) *Attorney, Agent, or Firm*—Renner, Otto, Boisselle & Sklar, LLP

(57) ABSTRACT

The invention provides a method of small geometry gate formation on the surface of a high-K gate dielectric. The method provides for processing steps that include gate pattern trimming, gate stack etch, and removal of exposed regions of the high-K dielectric to be performed efficiently in a single etch chamber. As such, process complexity and processing costs are reduced while throughput and overall process efficiency is improved. The method includes fabricating a high-K gate dielectric etch stop dielectric layer on the surface of a silicon substrate to protect the silicon substrate from erosion during an etch step and to prove a gate dielectric. A polysilicon layer is fabricated above the high-K dielectric layer. An anti-reflective coating layer above the polysilicon layer, and a mask is fabricated above the anti-reflective coating layer to define a gate region and an erosion region. The sequence of etching steps discussed above are performed in-situ in an enclosed high density plasma etching chamber environment.

20 Claims, 5 Drawing Sheets

PROCESS FOR FABRICATION OF A TRANSISTOR GATE INCLUDING HIGH-K GATE DIELECTRIC WITH IN-SITU RESIST TRIM, GATE ETCH, AND HIGH-K DIELECTRIC REMOVAL

RELATED APPLICATION

This application claims the benefit of U.S. Provisional Application No. 60/366,204 filed Dec. 28, 2001.

TECHNICAL FIELD

The present invention relates generally to the fabrication of silicon gate structures and more specifically to improvements in fabricating a narrow gate structure on a high-K dielectric, for a high density gate array on a silicon integrated circuit.

BACKGROUND OF THE INVENTION

Many silicon devices used in modern integrated circuits utilize a field effect transistor structure that comprises a polysilicon gate positioned over a channel region within a silicon wafer. For example, a typical field effect transistor cell comprises such a structure with a insulating layer separating the polysilicon gate from the channel region. As another example, a typical floating gate flash memory cell includes additional layers between the polysilicon gate and the channel region that comprise a tunnel oxide layer, a floating gate layer, and an oxide-nitride-oxide (ONO) layer. In addition to these examples, cell structures for read only memory (ROM), random access memory (RAM), SONOS type flash memory, and other planar silicon integrated circuit structures all utilize a polysilicon gate positioned over a channel region.

The typical process for fabricating a polysilicon gate is to first grow an oxide on the surface of a wafer followed by applying a polysilicon layer. An anti-reflective coating and a photoresist layer are then deposited over the polysilicon layer, patterned, and developed to mask the polysilicon gate. An anisotropic etch is then used to remove the un-masked polysilicon such that the polysilicon gate is formed.

It is a generally recognized goal to decrease the size of the polysilicon gate. First, decreasing the gate size permits decreasing the size of each individual silicon device. Decreasing the size of each devices provides the ability to increase the density of a device array fabricated on a wafer which, provides the ability to fabricate a more complex circuit with a faster operating speed on a wafer of a given size. Secondly, a smaller channel region beneath a smaller gate reduces capacitance across the channel/source junction and the channel drain junction which provides for faster operating speed and reduced power consumption.

One problem with reducing the gate size is that these exists a minimum physical thickness of the gate oxide at which the oxide no longer isolates the gate from the channel region. Because smaller gate sizes require better capacitive coupling between the gate and the channel region and because the gate oxide can not be scaled below the minimum thickness, other dielectrics with dielectric constants greater than silicon dioxide (e.g high K dielectrics) may be used to replace the conventional gate oxide to improve capacitive coupling. However, high K dielectrics react to various etching chemistries differently than silicon dioxide and therefore the use of a high K gate dielectric requires different fabrication methods than a similar structure with a conventional gate oxide.

Another problem with reducing gate size is that limitations on the masking and etching processes limit gate size. For example, the resolution of the photoresist masking processes provides a limit on the minimum gate size and etching processes for etching vertical surfaces perpendicular to the horizontal mask further limit the minimum gate size due to erosion and other effects that degrade the etch profile.

Accordingly there is a strong need in the art for a method of fabricating a narrow polysilicon gate that provides for reduced gate size and improved side wall tolerance. There is also a strong need in the art for such method to provide for improved capacitive coupling and improved isolation between the channel region and the gate to support a narrower polysilicon gate.

SUMMARY OF THE INVENTION

A first aspect of the present invention is to provide an efficient method of small geometry gate formation on the surface of a high-K gate dielectric. The method provides for processing steps that include gate pattern trimming, gate stack etching, and the removal or exposed regions of the high-K dielectric to be performed efficiently in a single etch chamber. Such method of performing in-situ resist trim, gate etch, and high-K gate dielectric removal provides for a simplified process over known fabrication methods along with improving throughput. The method also reduces wafer handling and opportunities for contamination. The method comprises fabricating a gate dielectric etch stop layer above a polysilicon substrate. The gate dielectric etch stop layer comprising a material that has a dielectric constant greater than the dielectric constant of silicon dioxide and forms the gate dielectric in a region of the wafer that becomes the gate and forms a barrier to prevent polysilicon etching chemistries from damaging the polysilicon silicon substrate in regions along side the gate. The method further comprises sequentially: a) fabricating a polysilicon layer above the gate dielectric etch stop layer; b) fabricating a bottom anti reflective coating (BARC) above the polysilicon layer; and c) fabricating a photoresist layer over the BARC. The photoresist layer is then patterned and developed to form a mask over a gate region and to expose an erosion region about the periphery of the gate region.

The wafer is placed in an enclosed etching environment with a high density plasma and, optionally an inert gas. The inert gas may be argon. While in such an etching environment the following etch processes are in-situ performed: a) a portion of the mask is etched to form a trimmed mask over a narrow gate region and to increase the size of the erosion region using an etch chemistry selective between the photoresist and the anti reflective coating, the trimmed mask dimension is beyond the capability of either 248 nm or 193 nm lithography; b) the anti reflective coating is etched within the erosion region; c) the polysilicon layer is etched using an etch chemistry selective between the polysilicon and each of the trimmed mask and the gate dielectric etch stop layer; and d) the gate dielectric etch stop layer is removed using an etch chemistry selective between the gate dielectric etch stop layer and polysilicon.

The gate dielectric etch stop layer may comprise a high K material selected from the group of $HfO_2$, $ZrO_2$, $CeO_2$, $Al_2O_3$, $TiO_2$, $Y_2O_3$. Within the environment, the step of trimming or etching a portion of the mask may comprise use of at least one of $HBr$, $CL_2$, $N_2$, $He$ and $O_2$ and the step of etching the anti reflective coating may comprises use of $CF_4$ or $CHF_3$. The step of etching the polysilicon layer may comprise use of $HBr$, $Cl_2$, $CF_4$, and $HeO_2$ (a combination of Oxygen diluted with a large amount of Helium provided to the etch chamber through a single mass flow controller), in a bias field to improve a vertical side profile between the gate region and the erosion region of the polysilicon. The $HeO_2$ increases the selectivity between the polysilicon and the gate dielectric etch stop layer. Other etch parameters may also be used to improve the selectivity between the polysilicon and the gate dielectric etch stop layer. The step of removing the gate dielectric etch stop layer comprises use of HBr and, He with the addition of fluorine gas.

A second aspect of the present invention is to provide a similar method for fabricating a non volatile memory device on the surface of a polysilicon wafer utilizing in-situ resist trim, control gate etch, interpoly dielectric etch, polysilicon etch, and tunnel dielectric removal. The method comprises fabricating a tunnel dielectric etch stop layer above a polysilicon substrate. The tunnel dielectric etch stop layer comprises a material that has a dielectric constant greater than the dielectric constant of silicon dioxide and forms the tunnel dielectric in a region of the wafer that becomes the memory cell and forms a barrier to prevent polysilicon etching chemistries from damaging the polysilicon silicon substrate in regions along side the memory cell. The method further comprises sequentially: a) fabricating a polysilicon layer above the tunnel dielectric etch stop layer; b) fabricating an interpoly dielectric layer above the polysilicon layer; c) fabricating a polysilicon control gate layer above the interpoly dielectric layer; d) fabricating an anti reflective coating above the polysilicon layer; and e) fabricating a photoresist layer over the anti reflective coating layer. The photoresist layer is then patterned and developed to form a mask over a memory cell region and to expose an erosion region about the periphery of the memory cell region.

The wafer is placed in an enclosed etching environment with a high density plasma and, optionally an inert gas. The inert gas may be argon. While in such an etching environment the following etch processes are performed in-situ. First, a portion of the mask is etched to form a trimmed mask over a narrow memory cell region and to increase the size of the erosion region using an etch chemistry selective between the photoresist and the anti reflective coating. The trimmed mask has a mask dimension smaller than the capability of the lithography process (248 nm or 193 nm). Secondly, the anti reflective coating is etched within the erosion region. Thirdly, the polysilicon gate is etched using an etch chemistry selective between the polysilicon and the trimmed mask. Fourthly, the interpoly dielectric layer is etched using an etch chemistry selective between the interpoly dielectric and the trimmed mask. Fifthly, the polysilicon layer is etched using an etch chemistry selective between the polysilicon and each of the trimmed mask and the tunnel dielectric etch stop layer. And, sixthly, the tunnel dielectric etch stop layer is removed using an etch chemistry selective between the tunnel dielectric etch stop layer and polysilicon.

The tunnel dielectric etch stop layer may comprise a high K material selected from the group of $HfO_2$, $ZrO_2$, $CeO_2$, $Al_2O_3$, $TiO_2$, $Y_2O_3$. The inert gas may be argon. Within the environment, the step of trimming or etching a portion of the mask may comprise use of at least one of HBr, $CL_2$, $N_2$, He and $O_2$ and the step of etching the anti reflective coating may comprises use of $CF_4$ or $CHF_3$. The step of etching each of the polysilicon gate dielectric layer and the interpoly dielectric layer may comprise the use of HBr, $Cl_2$, $CF_4$, and $HeO_2$, in a bias field to improve a vertical side profile between the gate region and the erosion region. Further, etching the polysilicon layer may comprise use of HBr, $Cl_2$, $CF_4$, and $HeO_2$ in combination with $HeO_2$ to increase the selectivity between the polysilicon and the tunnel dielectric etch stop layer. Other etch parameters may also be used to improve the selectivity between the polysilicon and the tunnel dielectric etch stop layer. The step of etching the tunnel dielectric etch stop layer comprises use of HBr and, He with the addition of fluorine gas.

For a better understanding of the present invention, together with other and further aspects thereof, reference is made to the following description, taken in conjunction with the accompanying drawings, and its scope will be pointed out in the appended claims.

DESCRIPTION OF THE PREFERRED EMBODIMENTS

The present invention will now be described in detail with reference to the drawings. The diagrams are not drawn to scale and the dimensions of some features are intentionally drawn larger than scale for purposes of showing clarity.

Figure 1:
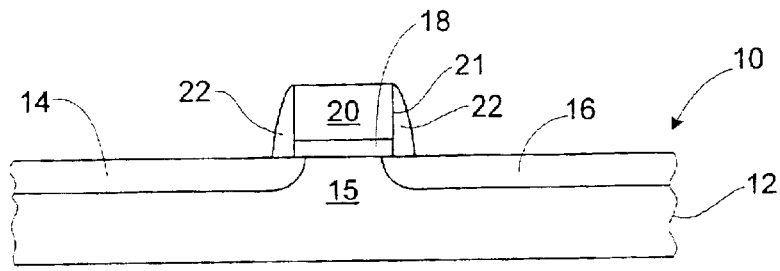
FIG. 1 is a schematic, cross sectional view of a narrow gate field effect transistor silicon device in accordance with one embodiment of the present invention.

Referring to FIG. 1, an exemplary field effect transistor (FET) 10 in accordance with the present invention is shown. The FET 10 comprises a lightly doped p-type crystalline silicon substrate 12 and an implanted n-type source region 14 and drain region 16. However, it should be appreciated that the lightly doped silicon substrate may be n-type and the source region 12 and the drain region 16 may be implanted p-type. Between the source region 14 and the drain region 16 is a central channel region 15. Above the central channel region 15 is a mesa 21 comprising a gate dielectric layer 18 and a polysilicon gate 20. Side wall spacers 22 isolate the mesa 21. In the exemplary embodiment, the gate dielectric layer 18 comprises a material with a dielectric constant greater than that of silicon dioxide which is typically used for a gate oxide layer.

The benefit of a gate dielectric layer 18 with a dielectric constant greater than that of silicon dioxide is that the physical thickness of the gate dielectric layer 18 may be greater without reduced capacitive coupling between the polysilicon gate 20 and the channel region 15. Or, stated in the alternative, a gate dielectric layer 18 with a dielectric constant greater than silicon dioxide provides greater capacitive coupling between the polysilicon gate 20 and the channel region 15 than would a dielectric layer comprising silicon dioxide of the same physical thickness. Because greater capacitive coupling between the polysilicon gate 20 and the channel region 15 is required when the length of the channel region 15 (the distance between the source region 14 and the drain region 16) is reduced, the gate dielectric layer 18 with a dielectric constant greater than that of silicon dioxide permits the FET 10 to have a channel length below the minimum length that would be required to properly couple the polysilicon gate 20 to the channel region 15 through the minimum physical thickness of silicon dioxide required to prevent electron tunneling between the polysilicon gate 20 and the channel region 15.

In the exemplary embodiment, the gate dielectric layer 18 comprises a material selected from the group of $HfO_2$, $ZrO_2$, $CeO_2$, $Al_2O_3$, $TiO_2$, $Y_2O_3$, and other binary and tertiary metal oxides and ferroelectric material having a dielectric constant greater than 20. The selected material is referred to herein as a "high K material" because it has a dielectric constant greater than silicon dioxide and therefore provides capacitive coupling equivalent to an oxide thickness of one nanometer or less while maintaining an adequate physical thickness to prevent charge tunneling. Because some of the materials in the group may form an incompatible boundary with crystalline silicon, a barrier interface layer may exist both above and below the high-K gate dielectric layer 18 to provide a buffer interface between the high K material and the polysilicon gate 20 and a buffer interface between the high K material and the polysilicon channel region 15. Each buffer interface layer may be silicon dioxide having a thickness of about 0.5 nm to about 0.7 nm.

Because the high K material has a dielectric constant approximately 3 times that of silicon dioxide, the thickness of the gate dielectric layer 18 may be approximately 3 times greater than that of silicon dioxide and yet there will be the same capacitive coupling between the polysilicon gate 20 and the channel region 15. Comparing a FET with a silicon dioxide gate dielectric layer with FET 10 with the high K material underlying layer of approximately the same thickness, the other dimensions of FET 10 may be approximately three times smaller than those of the FET with the silicon dioxide gate layer.

Figure 2:
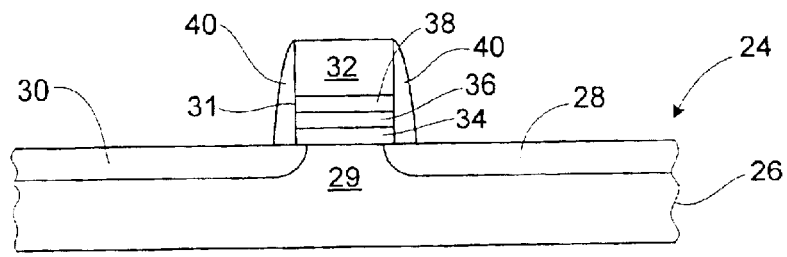
FIG. 2 is a schematic, cross sectional view of a narrow floating gate memory cell silicon device in accordance with one embodiment of the present invention.

Turning to FIG. 2, an exemplary non volatile memory cell 24 in accordance with the present invention is shown. The memory cell 24 comprises a lightly doped p-type crystalline silicon substrate 26 and an implanted n-type source region 30 and drain region 28. Again, it should be appreciated that the lightly doped silicon substrate may be n-type and the source region 30 and the drain region 28 may be implanted p-type. A central channel region 29 is positioned between the source region 30 and the drain region 28. Positioned above the central channel region 29 is a mesa 31 comprising a tunnel dielectric layer 34, a polysilicon floating gate 36, and an interpoly dielectric layer 38 (which may be an oxide-nitride-oxide (ONO) stack), and a polysilicon control gate 32. Side wall spacers 40 isolate the mesa 31. In the exemplary embodiment, the tunnel dielectric layer 34 comprises a material with a dielectric constant greater than that of silicon dioxide which is typically used for a tunnel oxide layer. The tunnel dielectric layer 34 includes a material with a dielectric constant greater than that of silicon dioxide such that the length of the channel region 29 to be scaled to a smaller dimension without scaling the thickness of the tunnel dielectric layer 34 to a dimension where unwanted tunneling occurs between the floating gate 36 and the channel region 29. The tunnel dielectric layer 34 may comprise a high K material selected from the group of $HfO_2$, $ZrO_2$, $CeO_2$, $Al_2O_3$, $TiO_2$, $Y_2O_3$, and other binary and tertiary metal oxides and ferroelectric material having a dielectric constant greater than 20.

Figure 3:
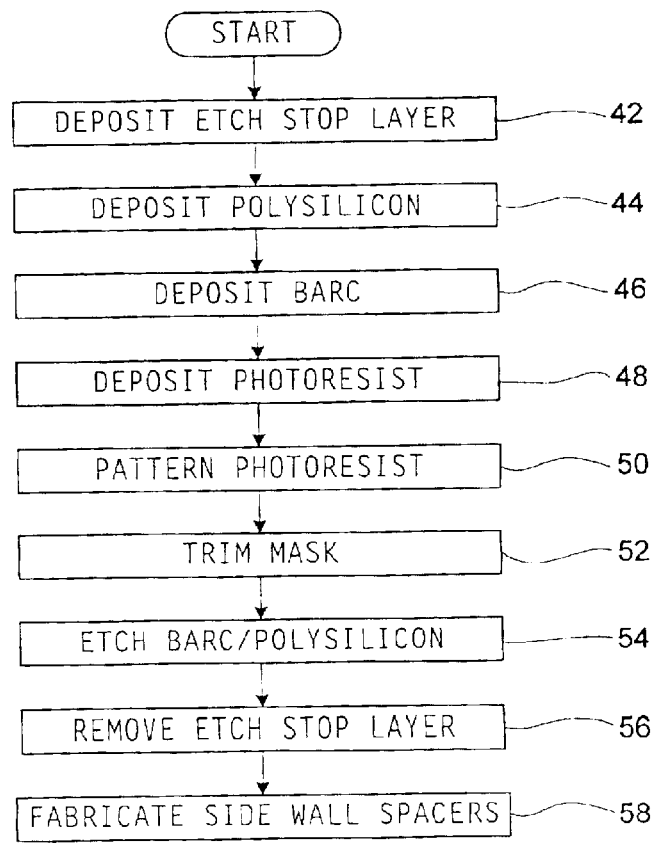
FIG. 3 is a flow chart showing exemplary steps for fabricating a narrow gate silicon device in accordance with one embodiment of the present invention.

Turning to the flowchart of FIG. 3 in conjunction with the schematic cross section diagrams of FIGS. 4a–4g, an exemplary process for fabricating the gate 20 of FIG. 1 is shown.

Step 42 represents depositing a gate dielectric etch stop layer 62 on the surface of a silicon substrate 60. The gate dielectric etch stop layer 62 will become the gate dielectric layer 18 of the mesa 21. In the exemplary embodiment, the gate dielectric etch stop layer 62 comprises the high K material. More specifically, step 42 may represent first depositing a buffer interface layer of silicon dioxide on the surface of the silicon substrate using low temperature thermal oxidation, a remote plasma deposition process, an atomic layer deposition process, or a similar process for fabricating silicon dioxide on silicon to an approximate thickness of 0.5 nm–0.7 nm. Secondly, the high k material may be deposited on the buffer interface layer using low pressure chemical vapor deposition to a thickness selected to provide adequate capacitive coupling appropriate for the selected channel length. And thirdly, another buffer interface layer of silicon dioxide is fabricated, on the surface of the high K material, again to a thickness of approximately 0.5 nm–0.7 nm using the techniques discussed above.

Step 44 represents depositing a polysilicon layer 64 on the surface of the gate dielectric etch stop layer 62 (or the buffer interface layer if used). This polysilicon layer 64 will become the polysilicon gate 20. In the exemplary process the polysilicon layer 64 is deposited using a low pressure chemical vapor deposition process.

Step 46 represents depositing a bottom anti-reflective coating (BARC) 66 on the surface of the surface of the polysilicon layer 64. The BARG 66 may be an organic or inorganic compound that provides for an interface with the polysilicon layer 64 that is substantially non-reflective. The thickness of the BARC 66 is dependent upon the optical properties of the BARC and the interface between the BARC 66 and the polysilicon layer 64 such that illumination incident on the surface of the BARC 66 is generally not reflected back through the surface of the BARC 66. Low pressure chemical vapor deposition or plasma enhanced chemical vapor deposition may be used to deposit the BARC 66.

Figure 4A:
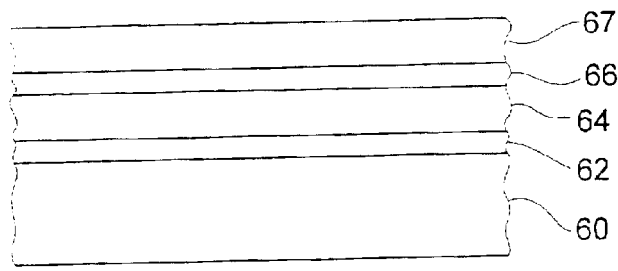
FIG. 4a is a schematic cross sectional view of a processing step in the fabrication of a narrow gate silicon device in accordance with one embodiment of the present invention.

Step 48 represents depositing a mask layer 67 of a photoresist material on the surface of the BARC layer 66 as is shown in FIG. 4a. In the exemplary embodiment, the photoresist material is a 193 nm or a 248 nm photoresist material, which supports patterning of a developed image critical dimension (DICD) ×1 on the order of 90 nm to 180 nm for a typical 0.18 micron technology node. The thickness of the mask layer 67 is dependent upon the optical properties of the photoresist material and the target DICD. In an exemplary embodiment, a 248 nm photoresist would be deposited to a thickness of between 1500 A and 5000 A or, for a more narrow range, a thickness of between 2000 A and 4000 A. In the exemplary embodiment, a 193 nm photoresist would be deposited to a thickness of between 1000 A and 4500 A, or, for a more narrow range, a thickness of between 2000 A and 3500 A.

Figure 4B:
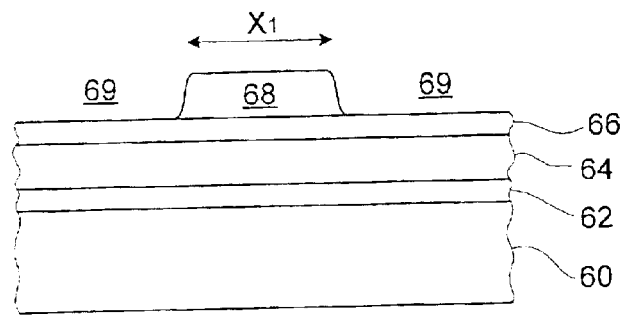
FIG. 4b is a schematic cross sectional view of a processing step in the fabrication of a narrow gate silicon device in accordance with one embodiment of the present invention.

Step 50 represents patterning the photoresist using conventional stepper or scanner photolithography technologies to form a mask 68 on the surface of the ARC layer 66 that defines and masks a gate region 68 and defines and exposes an erosion region 69 as is shown in FIG. 4b.

More specifically, a UV or a 193 nm wave length light source and a reticle provides collimated illumination of a wavelength that corresponds to the selected photoresist material to expose and pattern the photoresist layer 67. A developer solution preserves the unexposed areas of the photoresist layer 67 and washes the photoresist away in the exposed portions thereby leaving the unexposed portions as a photoresist mask on the surface of the BARC layer 66 within the gate region 68. It should be appreciated that the photolithography processes have a resolution limit that limits the minimum size of the photoresist mask. Therefore, because one of the objectives of this invention is to provide a narrow gate that is smaller than the limits of resolution of the photolithography processes, in the exemplary embodiment, the photolithography processes are used to make the minimum sized photoresist mask in accordance with known methods. Known photolithography processes can be used to form a gate mask with a DIDC ×1 of approximately 90 nm to 180 nm.

Figure 4C:
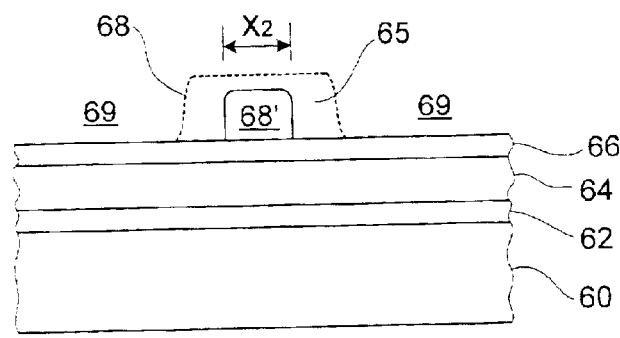
FIG. 4c is a schematic cross sectional view of a processing step in the fabrication of a narrow gate silicon device in accordance with one embodiment of the present invention.

Step 52 represents the first etching step in a series of etching steps that are to be performed utilizing etch chemistries that are compatible with each other and can be performed in a single etch environment without breaking the vacuum seal between etch steps. The environment may include high density plasma and may also include an inert gas such as argon. As such, step 52 represents sealing the wafer in an etch chamber and etching the photoresist to trim the photoresist from the DIDC dimension to a final image critical dimension ×2 to less than 50 nm, or for a more narrow range, to less than 30 nm. More specifically, the mask is eroded or trimmed to form a narrow gate mask that masks a narrow gate region 68' within the gate region 68 as is shown in FIG. 4c at step 52. In the exemplary embodiment, at least one of HBr, $Cl_2$, He, $N_2$, and $O_2$ is used to etch the mask such that the narrow mask region 68' remains while the portion 65 is removed.

Figure 4D:
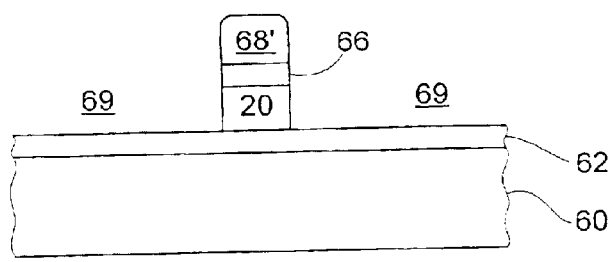
FIG. 4d is a schematic cross sectional view of a processing step in the fabrication of a narrow gate silicon device in accordance with one embodiment of the present invention.
Figure 4E:
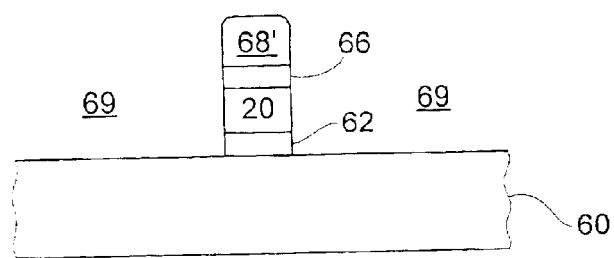
FIG. 4e is a schematic cross sectional view of a processing step in the fabrication of a narrow gate silicon device in accordance with one embodiment of the present invention.

Step 54 represents etching or eroding the BARC layer 66 and the polysilicon layer 64 in the erosion region 69 to form the polysilicon gate 20 as is shown in FIG. 4d. Erosion of the BARC layer 66 may include an etch chemistry such as $CF_4$ or $CHF_3$ in the inert gas environment. Erosion of the polysilicon layer 64 may include an ion bombardment etch using HBr, $CF_4$, $CL_2$ in combination with $HeO_2$ to increase the selectivity between the polysilicon and the high K material in the gate dielectric etch stop layer 62. Other etch parameters may also be adjusted to assure that the polysilicon etch is generally un-reactive with underlying high-K material. Increasing the selectivity enables the etch to be performed with an increased bias power and a reduced pressure (than would be enabled without the $HeO_2$) without causing the etch to penetrate the gate dielectric etch stop layer 62. This increased bias power and reduced pressure improves the vertical tolerance of the gate 20 side wall profile.

At step 56, the gate dielectric etch stop layer 62 within the erosion region 69 is removed using an etch chemistry of HBr, He, or $CF_4$ in the environment which is selective between the high K material and polysilicon. As such, the erosion at step 56 does not significantly effect the sidewall profile of the gate 20 and does not significantly penetrate into the polysilicon layer 64 beneath the gate dielectric etch stop layer 62.

It should be appreciated that the above described etch chemistries are compatible chemistries and may performed sequentially within the etch chamber without the breaking the vacuum seal.

Figure 4F:
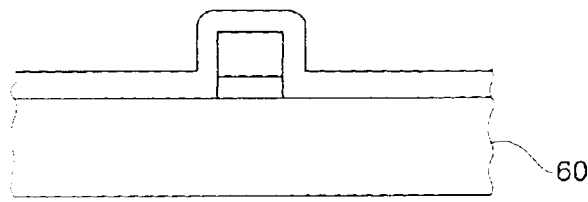
FIG. 4f is a schematic cross sectional view of a processing step in the fabrication of a narrow gate silicon device in accordance with one embodiment of the present invention.
Figure 4G:
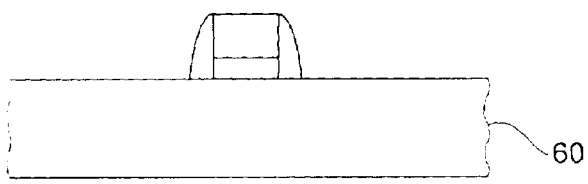
FIG. 4g is a schematic cross sectional view of a processing step in the fabrication of a narrow gate silicon device in accordance with one embodiment of the present invention.

Step 58 represents fabricating side wall spacers by depositing a nitride layer over the entire surface of the device as is shown in FIG. 4f, and represents use of an anisotropic etch to remove the nitride from the horizontal surfaces leaving side wall spacers 22 as shown in FIG. 4g.

Figure 5:
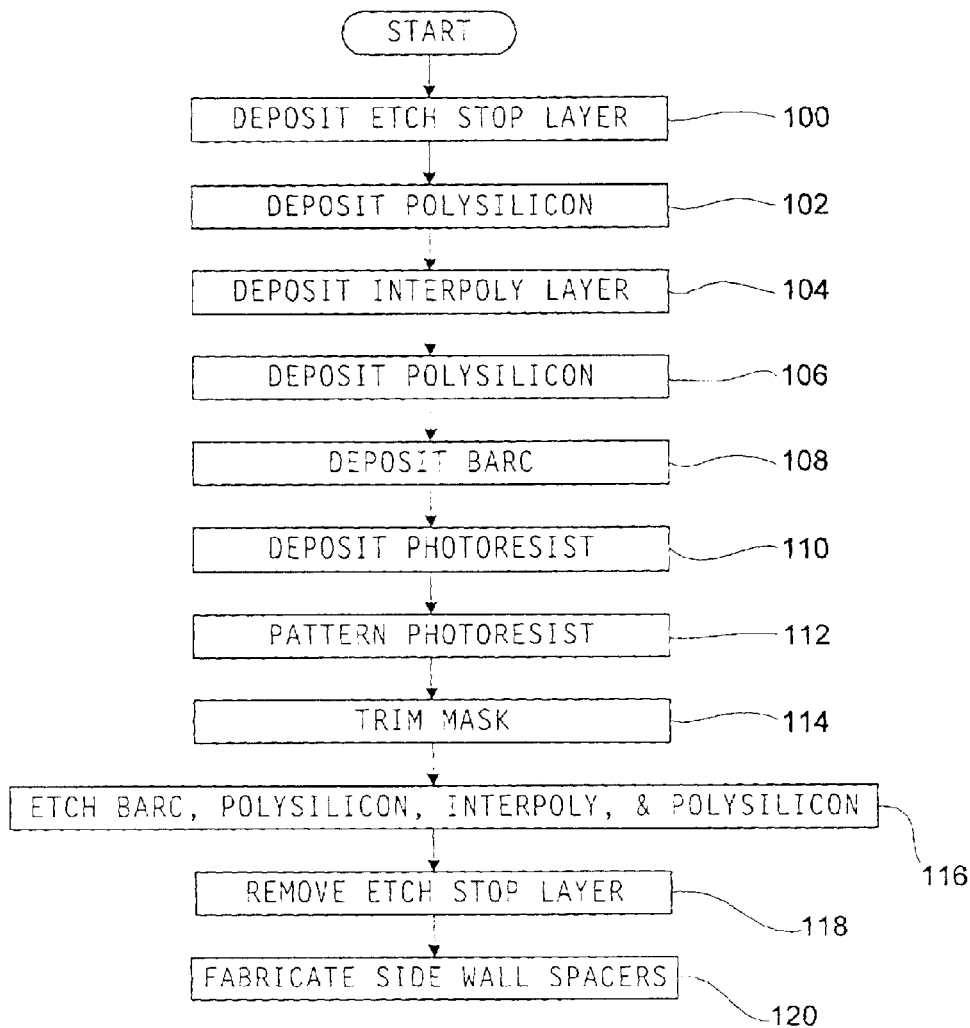
FIG. 5 is a flow chart showing exemplary steps for fabricating a narrow non volatile memory device in accordance with one embodiment of the present invention.

The flowchart of FIG. 5 represents exemplary steps in the fabrication of the mesa 31 for a non volatile memory cell 24 of FIG. 2. Turning to the flowchart of FIG. 5 in conjunction with the schematic cross section diagrams of FIGS. 6a–6g, an exemplary process for fabricating a mesa 31 is shown.

Step 100 represents depositing a tunnel dielectric etch stop layer 72 on the surface of a silicon substrate 70. The tunnel dielectric etch stop layer 72 will become the tunnel dielectric layer 34 of mesa 31 (FIG. 2). In the exemplary embodiment, the tunnel dielectric etch stop layer comprises the high K material. More specifically, step 100 may represent first depositing a buffer interface layer of silicon dioxide on the surface of the silicon substrate using low temperature thermal oxidation, a remote plasma deposition process, an atomic layer deposition process, or a similar process for fabricating silicon dioxide on silicon to an approximate thickness of 0.5 nm–0.7 nm. Secondly, the high k material may be deposited on the buffer interface layer using low pressure chemical vapor deposition to a thickness selected to provide adequate capacitive coupling appropriate for the selected channel length. And thirdly, another buffer interface layer of silicon dioxide is fabricated, on the surface of the high K material, again to a thickness of approximately 0.5 nm–0.7 nm using the techniques discussed above.

Step 102 represents deposing a polysilicon layer 74 on the surface of the tunnel dielectric etch stop layer 72 (or the buffer interface layer if used). This polysilicon layer 74 will become the polysilicon floating gate 36 of mesa 31 (FIG. 2) In the exemplary process the polysilicon layer 64 is deposited using LPCVD.

Step 104 represents depositing an interpoly dielectric layer 76 on the surface of the polysilicon layer 74. More specifically, depositing the interpoly dielectric layer 76 may comprise: a) depositing a buffer interface layer of silicon dioxide on the surface of the polysilicon layer 74 using low temperature thermal oxidation (~500C), a remote plasma deposition process, an atomic layer deposition process, or a similar process for fabricating silicon dioxide on silicon to an approximate thickness of 0.5 nm–0.7 nm; b) depositing a nitride layer on the buffer interface layer using low pressure chemical vapor deposition; and c) depositing another buffer interface layer of silicon dioxide between 0.5 nm and 0.7 nm in thickness on the surface of the nitride.

Step 106 represents depositing a polysilicon control gate layer 78 on the surface of the interpoly dielectric layer 76. Depositing the polysilicon control gate layer 78 may include depositing polysilicon using a chemical vapor deposition process.

Step 108 represents depositing a BARC layer 80 on the surface of the polysilicon control gate layer 78. The BARC layer 80 may be an organic or inorganic compound that provides for an interface with the polysilicon control gate layer 78 that is substantially non-reflective. The thickness of the BARC layer 80 is dependent upon the optical properties of the BARC and the interface between the BARC layer 80 and the polysilicon control gate layer 78 such that illumination incident on the surface of the BARC layer 80 is generally not reflected back through the surface of the BARC layer 80. Low pressure chemical vapor deposition or plasma enhanced chemical vapor deposition may be used to deposit the BARC layer 80.

Figure 6A:
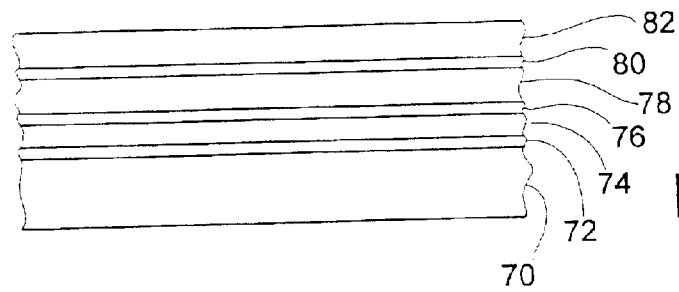
FIG. 6a is a schematic cross sectional view of a processing step in the fabrication of a non volatile memory device in accordance with one embodiment of the present invention.
Figure 6B:
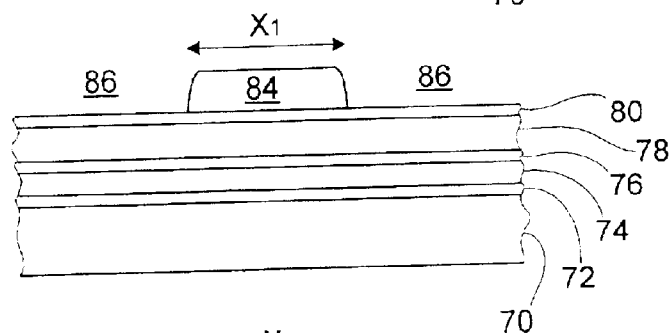
FIG. 6b is a schematic cross sectional view of a processing step in the fabrication of a non volatile memory device in accordance with one embodiment of the present invention.

Step 110 represents depositing a mask layer 82 of a photoresist material on the surface of the BARC layer 80 as is shown in FIG. 6a. In the exemplary embodiment, the photoresist material is a 193 nm or a 248 nm photoresist material, which supports patterning of a developed image critical dimension (DICD) x1 on the order of 90 nm to 180 nm for a typical 0.18 micron technology node. The thickness of the mask layer 82 is dependent upon the optical properties of the photoresist material and a DICD target. In an exemplary embodiment, a 248 nm photoresist would be deposited to a thickness of between 1500 A and 5000 A or, for a more narrow range, a thickness of between 2000 A and 4000 A. In the exemplary embodiment, a 193 nm photoresist would be deposited to a thickness of between 1000 A and 4500 A, or, for a more narrow range, a thickness of between 2000 A and 3500 A.

Step 112 represents patterning the photoresist using conventional stepper or scanner photolithography technologies to form a mask 84 on the surface of the BARC layer 80 that defines and masks a memory cell region 84 and defines and exposes an erosion region 86 as is shown in FIG. 4b.

More specifically, a UV or a 193 nm wave length light source and a reticle provides collimated illumination of a wavelength that corresponds to the selected photoresist material to expose and pattern the photoresist mask layer 82. A developer solution preserves the unexposed areas of the photoresist mask layer 82 and washes the photoresist away in the exposed portions thereby leaving the unexposed portions as a photoresist mask on the surface of the BARC layer 80 within the memory cell region 84. It should be appreciated that the photolithography processes have a resolution limit that limits the minimum size of the photoresist mask. Therefore, because one of the objectives of this invention is to provide a narrow gate that is smaller than the limits of resolution of the photolithography processes, in the exemplary embodiment, the photolithography processes are used to make the minimum sized photoresist mask in accordance with known methods. Known photolithography processes can be used to form a gate mask with a DIDC x1 of approximately 90 nm to 180 nm.

Step 114 represents a first etching step in a series of etching steps that are to be performed utilizing etch chemistries that are compatible with each other and can be performed in a single etch chamber environment without breaking the vacuum seal between etch steps. The environment may include high density plasma and may also include an inert gas such as argon. As such, step 114 represents sealing the wafer in an etch chamber and etching the photoresist to trim the photoresist from the DIDC dimension to a final image critical dimension x2 to less than 50 nm, or for a more narrow range, to less than 30 nm.

Figure 6C:
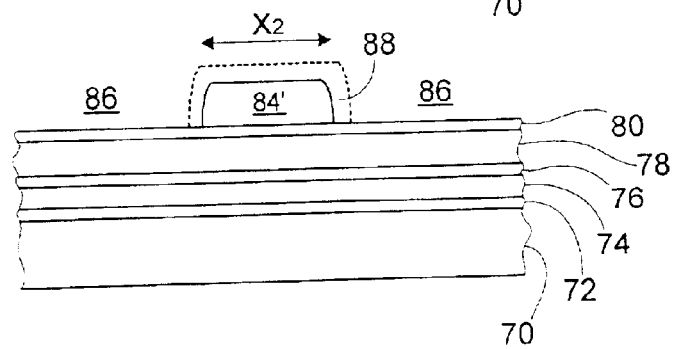
FIG. 6c is a schematic cross sectional view of a processing step in the fabrication of a non volatile memory device in accordance with one embodiment of the present invention.

More specifically, the mask is eroded or trimmed to form a narrow memory cell mask that masks a narrow memory cell region 84' within the memory cell region 84 as is shown in FIG. 6c. In the exemplary embodiment, at least one of HBr, Cl2, He, N2, and $O_2$ is used to etch the mask such that the region 84' remains while the portion 88 is removed.

Figure 6D:
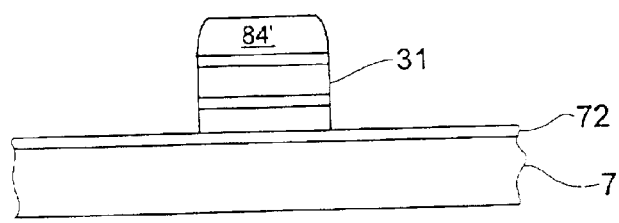
FIG. 6d is a schematic cross sectional view of a processing step in the fabrication of a non volatile memory device in accordance with one embodiment of the present invention.
Figure 6E:
FIG. 6e is a schematic cross sectional view of a processing step in the fabrication of a non volatile memory device in accordance with one embodiment of the present invention.

Step 116 represents etching or eroding the BARC layer 80, polysilicon control gate layer 78, the interpoly dielectric layer 76, and the polysilicon layer 74 to form the mesa 31 as shown in FIG. 6d. Erosion of the BARC layer 80 may include an etch chemistry such as CF4 or $CHF_3$. Erosion of the polysilicon control gate layer 78, and the interpoly dielectric layer 76 may include an ion bombardment etch using HBr,CL2, and fluorinated gases. And, after the interpoly dielectric layer 76 is removed, erosion of the polysilicon layer 74, may also include an ion bombardment etch using HBr and CL2 with $HeO_2$ added to increase the selectivity between the polysilicon and the high K material in the tunnel dielectric etch stop layer 72.

In the exemplary embodiment, erosion of the polysilicon control gate layer 78, the interpoly dielectric layer 76, and the polysilicon layer 74 will be performed in a single etch process using the HBr and the CL. The HeO2 will be introduced during a final portion of the etch process when the depth of the etch in the erosion region 86 approaches the tunnel dielectric etch stop layer 72. As such, the increased bias power and reduced pressure that provide for an improved vertical side wall tolerance may be used during the entire etch process.

At step 118, the tunnel dielectric etch stop layer 72 within the erosion region 86 is removed using an etch chemistry of HBr, He, or $CF_4$ in the environment which is selective between the high K material and polysilicon. As such, the erosion at step 118 does not significantly effect the vertical sidewall tolerance of the mesa 31 and does not significantly penetrate into the polysilicon 70 beneath the tunnel dielectric etch stop layer 72.

Figure 6F:
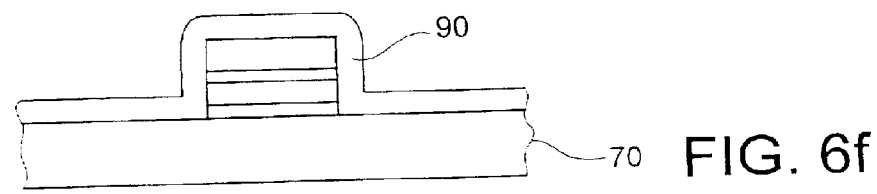
FIG. 6f is a schematic cross sectional view of a processing step in the fabrication of a non volatile memory device in accordance with one embodiment of the present invention.
Figure 6G:
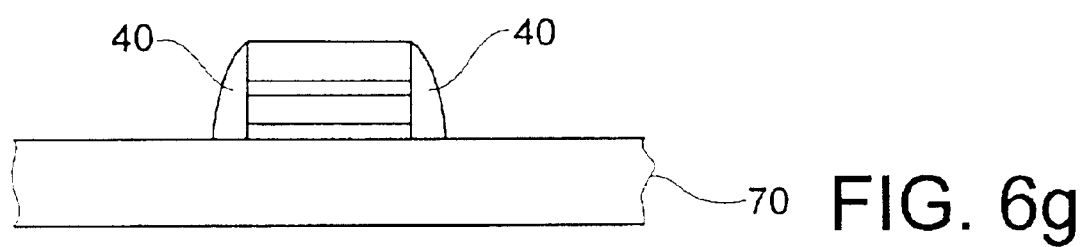
FIG. 6g is a schematic cross sectional view of a processing step in the as fabrication of a non volatile memory device in accordance with one embodiment of the present invention.

Step 120 represents fabricating side wall spacers by depositing a nitride layer 90 over the entire surface of the device as is shown in FIG. 6f, and represents use of an anisotropic etch to remove the nitride from the horizontal surfaces leaving side wall spacers 40 as shown in FIG. 6g.

In summary, the processes for fabricating a narrow mesa structure of this invention provides for fabrication of a smaller cell with improved sidewall tolerance. Although the methods have been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. An efficient method of small geometry gate formation on a surface of a high-K gate dielectric, the method comprising:

fabricating a gate dielectric etch stop layer above a silicon substrate, the gate dielectric etch stop layer comprising a material that has a dielectric constant greater than the dielectric constant of silicon dioxide;

fabricating a polysilicon layer above the gate dielectric etch stop layer;

fabricating an anti reflective coating above the polysilicon layer;

fabricating a photoresist layer over the anti reflective coating layer;

patterning the photoresist to form a mask over a gate region and expose an erosion region;

placing the substrate within an enclosed high density plasma etching environment and performing the following steps in-situ:

etching a portion of the mask to form a trimmed mask over a narrow gate region and to increase the size of the erosion region using an etch chemistry selective between the photoresist and the anti reflective coating;

etching the anti reflective coating within the erosion region;

etching the polysilicon layer using an etch chemistry selective between the polysilicon and each of the trimmed mask and the gate dielectric etch stop layer; and removing the gate dielectric etch stop layer using an etch chemistry selective between the gate dielectric etch stop layer and polysilicon.

2. The method of claim 1, wherein the gate dielectric etch stop layer comprises a high K material selected from the group of $HfO_2$, $ZrO_2$, $CeO_2$, $Al_2O_3$, $TiO_2$, $Y_2O_3$.

3. The method of claim 2, wherein the etching environment further includes an inert gas.

4. The method of claim 3, wherein the step of etching the polysilicon layer comprises use of HBr, $Cl_2$, and $HeO_2$, with a bias power to improve a vertical side wall profile between the gate region and the erosion region of the polysilicon; the $HeO_2$ increasing the selectivity between the polysilicon and the gate dielectric etch stop layer.

5. The method of claim 4, wherein the step of etching the gate dielectric etch stop layer comprises use of HBr and fluorinated gases.

6. The method of claim 5, wherein the step of etching a portion of the mask comprises use of at least one of HBr, $Cl_2$, He, $N_2$, and $O_2$.

7. The method of claim 6, wherein the step of eroding the anti reflective coating comprises use of $CF_4$ or $CHF_3$.

8. An efficient method of small geometry gate formation on the surface of a high-K gate dielectric, the method comprising:

fabricating a tunnel dielectric etch stop layer above a polysilicon substrate, the tunnel dielectric etch stop layer comprising a material that has a dielectric constant greater than the dielectric constant of silicon dioxide;

fabricating a polysilicon layer above the tunnel dielectric etch stop layer;

fabricating an interpoly dielectric layer above the polysilicon layer fabricating a polysilicon control gate layer above the interpoly dielectric layer;

fabricating an anti reflective coating above the polysilicon control gate layer;

fabricating a photoresist layer over the anti reflective coating layer;

patterning the photoresist to form a mask over a memory cell region and expose an erosion region;

placing the wafer within an enclosed high density plasma etching environment and performing the following steps in-situ:

etching a portion of the mask to form a trimmed mask over a narrow memory cell region and to increase the size of the erosion region using an etch chemistry selective between the photoresist and the anti reflective coating;

etching the anti reflective coating within the erosion region;

etching the polysilicon control gate layer;

etching the interpoly dielectric layer;

etching the polysilicon layer using an etch chemistry selective between the polysilicon and each of the trimmed mask and the tunnel dielectric etch stop layer; and removing the tunnel dielectric etch stop layer using an etch chemistry selective between the tunnel dielectric etch stop layer and polysilicon.

9. The method of claim 8, wherein the tunnel dielectric etch stop layer comprises a high K material selected from the group of $HfO_2$, $ZrO_2$, $CeO_2$, $Al_2O_3$, $TiO_2$, $Y_2O_3$.

10. The method of claim 9, wherein the etching environment further includes an inert gas.

11. The method of claim 10, wherein the step of etching the polysilicon layer comprises use of HBr, $Cl_2$, and $HeO_2$, the $HeO_2$ increasing the selectivity between the polysilicon and the etch stop layer.

12. The method of claim 11, wherein the step of etching the tunnel dielectric etch stop layer comprises use of HBr, He, and fluorinated gases.

13. The method of claim 12, wherein the step of etching a portion of the mask comprises use of at least one of HBr, $Cl_2$, He, $N_2$, and $O_2$.

14. The method of claim 13, wherein the step of etching the anti reflective coating comprises use of $CF_4$ or $CHF_3$.

15. The method of claim 1, further including the step of:

fabricating at least one buffer interface layer above or below the gate dielectric etch stop layer, the buffer interface layer providing a compatible boundary between a layer the gate dielectric etch stop layer is fabricated over or a layer fabricated over the gate dielectric etch stop layer.

16. The method of claim 15, wherein the buffer interface layer is interposed between the gate dielectric etch stop layer and the substrate, the buffer interface layer providing a compatible boundary between the substrate and the gate dielectric etch stop layer.

17. The method of claim 15, wherein the buffer interface layer is interposed between the gate dielectric etch stop layer and the polysilicon layer, the buffer interface layer providing a compatible boundary between the polysilicon layer and the gate dielectric etch stop layer.

18. The method of claim 8, further including the step of:

fabricating at least one buffer interface layer above or below the tunnel dielectric etch stop layer, the buffer interface layer providing a compatible boundary between a layer the tunnel dielectric etch stop layer is fabricated over or a layer fabricated over the tunnel dielectric etch stop layer.

19. The method of claim 18, wherein the buffer interface layer is interposed between the tunnel dielectric etch stop layer and the substrate, the buffer interface layer providing a compatible boundary between the substrate and the tunnel dielectric etch stop layer.

20. The method of claim 18, wherein the buffer interface layer is interposed between the tunnel dielectric etch stop layer and the polysilicon layer, the buffer interface layer providing a compatible boundary between the polysilicon layer and the tunnel dielectric etch stop layer.

* * * * *

UNITED STATES PATENT AND TRADEMARK OFFICE
CERTIFICATE OF CORRECTION

PATENT NO. : 6,790,782 B1
DATED : September 14, 2004
INVENTOR(S) : Yang et al.

It is certified that error appears in the above-identified patent and that said Letters Patent is hereby corrected as shown below:

Column 7,
Line 7, replace "BARG" with -- BARC --.

Signed and Sealed this

Twenty-first Day of December, 2004

JON W. DUDAS
*Director of the United States Patent and Trademark Office*